(12) United States Patent
Kawai (10) Patent No.: US 6,300,676 B1
(45) Date of Patent: Oct. 9, 2001

(54) SMALL SIZE ELECTRONIC PART AND A METHOD FOR MANUFACTURING THE SAME, AND A METHOD FOR FORMING A VIA HOLE FOR USE IN THE SAME

(75) Inventor: Hiroshi Kawai, Yokohama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/460,672

(22) Filed: Dec. 14, 1999

(30) Foreign Application Priority Data

Dec. 21, 1998 (JP) ................................................ 10-363381

(51) Int. Cl.$^7$ ............................. H01L 23/02; H01L 23/48
(52) U.S. Cl. ......................... 257/678; 257/774; 257/734; 257/691
(58) Field of Search ..................................... 257/678, 691, 257/602, 673, 684, 734, 739, 737, 774; 438/106, 121, 613, FOR 373, FOR 375

(56) References Cited

U.S. PATENT DOCUMENTS

| | | | |
|---|---|---|---|
| 4,435,737 | 3/1984 | Colton | 361/280 |
| 5,417,312 | * 5/1995 | Tsuchitani et al. | 188/181 |
| 5,729,038 | * 3/1998 | Young et al. | 257/460 |
| 6,140,144 | * 10/2000 | Najafi et al. | 438/53 |

FOREIGN PATENT DOCUMENTS

| | | |
|---|---|---|
| 2045754 | 2/1990 | (JP) . |
| 4009727 | 1/1992 | (JP) . |
| 5052867 | 3/1993 | (JP) . |
| 7273353 | 10/1995 | (JP) . |
| 10-38578 | * 2/1998 | (JP) . |
| 10213441 | 8/1998 | (JP) . |
| 11006778 | 1/1999 | (JP) . |

OTHER PUBLICATIONS

Patent Abstracts of Japan vol. 18, No. 624 (p.–1833), Nov. 28, 1994 and JP 06241932 A, Sep. 2, 1994.
Patent Abstracts of Japan vol. 1998, No.02, Jan. 30, 1998 and JP 09 283663 A Oct. 31, 1997.
Patent Abstracts of Japan vol. 1998, No. 13, Nov. 30, 1998 and JP 10 213441A Aug. 11, 1998.
Jae–joon Choi et al., "Silicon Angular Resonance Gyroscope By Deep ICPRIE and XeF$_2$ Gas Etching", The Proceeding of Micro Electro Mechanical System, 1998 IEEE 11$^{th}$ International Workshop pp. 322–327.
H. Hemmi et al., "Vacuum Package For Microsensors by Glass–silicon Anodic Bonging", Sensor and Actuators A, 43 (1994) pp. 243–248.
M. Esashi, "Micromachining for Packaged Sensors", The Proceeding of the 7$^{th}$ International Conference on Solid–State Sensors and Actuators.
M. Nagao et al., A silicon Micronmachined Resonant Angular Rate Sensor, pp. 212–217.

* cited by examiner

*Primary Examiner*—Jhihan B Clark
(74) *Attorney, Agent, or Firm*—Ostrolenk, Faber, Gerb & Soffen, LLP (57) ABSTRACT

A small size electronic part comprises a silicon substrate having a functional element and a signal output portion to output a signal from the functional element to outside the electronic part; a glass substrate provided on the silicon substrate such that the signal output portion of the silicon substrate is in contact with the glass substrate; a communicating hole provided in the glass substrate and at least a portion of the signal output portion of the silicon substrate so as to pass through the glass substrate and cut into at least a part of the signal output portion; and a conductive film provided on an inner wall surface of the communicating hole and extending on a surface of the glass substrate.

11 Claims, 11 Drawing Sheets

SMALL SIZE ELECTRONIC PART AND A METHOD FOR MANUFACTURING THE SAME, AND A METHOD FOR FORMING A VIA HOLE FOR USE IN THE SAME

BACKGROUND OF THE INVENTION

1. Field of the Invention

The present invention relates to a small size electronic part such as, for example, an angular velocity sensor, acceleration sensor, mechanical filter, etc. to a small size electronic part having an electrode terminal output providing an electric signal and a method for manufacturing such and a method for forming a via hole for use in such a small size electronic part.

2. Description of the Related Art

Generally, an angular velocity sensor, acceleration sensor, mechanical filter, etc. is widely known as a small size electronic part produced by a silicon micromachining technique. Further, such a small size electronic part comprises, for example, a silicon substrate, and glass substrates which are bonded to the upper and lower surfaces of the silicon substrate, respectively. A functional element for detecting an angular velocity is formed in the silicon substrate, for example, and the functional element is sealed by the two glass substrates.

Such a conventional small size electronic part may be mounted on the surface of a circuit board. Further, in order to make the circuit board small-sized, it is required to reduce the mounting surface of the small size electronic part. To this end, there has been known a small size electronic part in which a via hole passing through the upper glass substrate is formed and an electric signal is lead out from the functional element through the via hole so that the functional element and circuit board are electrically connected (See Japanese Unexamined Patent Publication No. 10-213441).

More specifically, in the small size electronic part, a glass substrate having a via or through hole therein is bonded to a silicon substrate, and conductive paste (or metal) is filled in the through hole, so that an external circuit board is made to be electrically connected to the functional element using the conductive paste.

The aforementioned conventional technique has a drawback that, when the conductive paste is filled in the through hole, air bubbles may be produced in the conductive paste. This causes a problem of contact failure caused by these air bubbles and the reliability is therefore decreased.

In particular, when the communicating hole is made of a small diameter and given that the electronic parts are made small-sized, air bubbles are more likely to be produced, and therefore in order to avoid this the through hole must be made of a larger diameter and accordingly there has been a problem that the part size is increased and the mounting surface increases in size.

Moreover, because the thermal expansion coefficient of the conductive paste is different from that of glass material, when a temperature change is produced in a small size electronic part, there are cases in which cracks occur in the glass substrate.

In order to lead out an electric signal from a functional element reliably, it is possible to provide a conductive film on the internal wall surface of the communicating hole as a substitute for the conductive paste. In this case, however, when a through hole is processed in a glass substrate by sandblasting, chips (broken pieces of glass or their traces) may be produced on the side of the surface of the glass substrate to which a silicon substrate is joined. Because of this, when the surfaces of a silicon substrate and glass substrate are joined, a step-like portion is produced between the silicon substrate and the through hole by the chip. As a result, when a conductive film is processed on the internal wall surface of the through hole, the conductive film may be disconnected by these step-like portions and there is a problem of decreased yields.

SUMMARY OF THE INVENTION

The present invention has been made in view of the above problems of the conventional technique, and it is an object of the invention to provide a small size electronic part in which a signal output from a functional element is lead to the outside reliably.

It is also an object of the invention to provide a method for manufacturing such a small size electronic part, as well as a method for forming a via hole for use in such a small size electronic part.

According to the invention, the small size electronic part comprises: a silicon substrate having a functional element and a signal output portion to output a signal from the functional element outside the electronic part; a glass substrate provided on the silicon substrate such that the signal output portion of the silicon substrate is in contact with the glass substrate; a communicating hole provided in the glass substrate and in at least a portion of the signal output portion of the silicon substrate so as to pass through the glass substrate and cut into at least a part of the signal output portion; and a conductive film provided on an inner wall surface of the communicating hole and extending on a surface of the glass substrate.

As constructed this way, the communicating hole is provided so as to pass through the glass substrate and in succession to this be cut into at least a part of the signal output portion, and the conductive film is provided on the internal wall surface of the through hole, and formed so as to extend to the surface side of the glass substrate. The internal wall surface of the communicating hole is continuously provided from the glass substrate to the silicon substrate. Because of this, disconnection of the conductive film caused by chips between the glass substrate and silicon substrate is avoided, and because of this conductive film, the functional element and the outside can be electrically connected through the signal output potion.

The functional element may be sealed by the glass substrate, so that the space for accommodating the functional element can be made substantially a vacuum. Because of this, for example, in a functional element containing a vibrator, the vibrator can be vibrated in a condition so that air resistance applied to the vibrator is reduced.

The communicating hole is preferably formed with a tapered shape so that the diameter is gradually reduced over from the opening side of a glass substrate to a silicon substrate. According to this structure, when the communicating hole is viewed from the opening side of the glass substrate nearly the whole of the internal wall surface can be made exposed, and a conductive film can be easily processed on the internal wall surface of the communicating hole by means of sputtering, etc.

A soldering bump may be provided in a part of a conductive film located on the surface side of the glass substrate. By connecting the soldering bump to an electrode pad, provided on an external circuit board, the functional element can be electrically connected to external equipment.

The functional element may be constructed as a detecting element for detecting external force including angular velocity and acceleration.

The small size electronic part may comprise another glass substrate bonded to a back side of the silicon substrate. According to this structure, the two glass substrates are bonded to the surface side and back side of the silicon substrate, whereby the functional element formed in the silicon substrate can be sealed.

The silicon substrate may comprise an SOI substrate having an insulating film, a first silicon layer in which a functional element and signal output portion are processed and which is provided on the surface side of the insulating film, and a second silicon layer which is provided on the back side of the insulating film, the glass substrate being provided on the surface side of the first silicon layer of the SOI substrate, and a communicating hole is provided in the glass substrate and first silicon layer. In this way, a small size electronic part can be also be constructed using an SOI substrate.

A method of manufacturing a small size electronic part according to the invention comprises a thin portion processing step for processing a thin portion in a silicon substrate by providing a concave groove portion on a first surface of the silicon substrate, a first joining step for joining the surface of a first glass substrate to the surface of the silicon substrate, a functional element processing step for processing a functional element and a signal output portion to output a signal from the functional element to the outside in the thin portion of the silicon substrate, a second joining step for joining the surface of a second glass substrate having an accommodating concave portion comprising a closed space to accommodate the functional element to a second surface of the silicon substrate, a communicating hole processing step for processing a communicating hole provided so as to pass through at least either of the fist and second glass substrate and in succession to this be further cut into at least a part of the signal output portion, and a conductive film processing step for providing a conductive film on the internal wall surface of the through hole.

According to such a manufacturing method of a small size electronic part, first in a thin portion processing step a thin portion is processed by providing a concave groove potion on a first surface of a silicon substrate, next in a first joining step the surfaces of the silicon substrate and a first glass substrate are joined by means of anodic bonding, next in a functional element processing step a functional element and signal output portion are processed in the thin portion and the surface of a second glass substrate is joined to a second surface of the silicon substrate. In addition to this, in a communicating hole processing step, a communicating hole is provided so as to pass through at least either of the first and second glass substrate and in succession to this processed so as to be further cut into at least a part of the signal output portion. Last, in a conductive film processing step on the internal wall surface of the communicating hole, a conductive film electrically connected to the functional element through the signal output portion is provided, for example, by means of sputtering, evaporation, etc.

In this way, as the communicating hole is provided so as to pass through the glass substrate and in succession to this further cut into the silicon substrate after the surfaces of the silicon substrate and glass substrate have been joined, the conductive film will not be disconnected between the glass substrate and silicon substrate and the functional element and the outside can be electrically connected by the conductive film.

A manufacturing method of a small size electronic part according to the invention comprises a concave portion processing step for processing a concave portion on the surface of a first glass substrate, a first joining step for joining a first surface of a silicon substrate to the surface of the first glass substrate having the concave portion, a functional element processing step for processing a functional element in the part of the silicon to cover the concave portion and processing a signal output portion to output a signal from the functional element, a second joining step for joining the surface of a second glass substrate having an accommodating concave portion comprising a closed space to accommodate the functional element to a second surface of the silicon substrate, a communicating hole processing step for processing a communicating hole provided so as to pass through at least either of the first and second glass substrate and in succession to this be further cut into at least a part of the signal output portion, and a conductive film processing step for providing a conductive film on the internal wall surface of the through hole.

According to such a manufacturing method of a small size electronic part, first in a concave portion processing step a concave portion is processed on the surface of a first glass substrate, next in a first joining step a first surface of a silicon substrate is joined to the surface of the first glass substrate, next in a functional element processing step a functional element is processed in a part of the silicon to cover the concave portion and a signal output portion to output a signal from the functional element is processed, and further in a second joining step the surface of a second glass substrate is joined to a second surface the silicon substrate. In addition to this, in a communicating hole processing step a communicating hole provided so as to pass through at least either of the first and second glass substrate and in succession to this be further cut into at least a part of the signal output portion, is processed by, for example, sandblasting. Last, in a conductive film processing step a conductive film electrically connected to the functional element is provided on the internal wall surface of the communicating hole by evaporation means such as, for example, sputtering, etc. Through this conductive film the silicon substrate and the outside can be electrically connected.

A method of manufacturing a small size electronic part according to the invention comprises a functional element processing step for processing a functional element and a signal output portion to output a signal from the functional element to the outside in a first silicon layer of an SOI substrate made up of an insulating film, the first silicon layer provided on the surface side of the insulating film, and a second silicon layer provided on the back side of the insulating film, a joining step for joining the surface of a glass substrate having an accommodating concave portion comprising a closed space to accommodate the functional element to the surface of the first silicon layer of the SOI substrate, a communicating hole processing step for processing a communicating hole provided so as to pass through the glass substrate and in succession to this be further cut into at least a part of the signal output portion, and a conductive film processing step for processing a conductive film on the inner wall surface of the through hole.

According to such a manufacturing method of a small size electronic part, first in a functional element processing step in a first silicon layer of an SOI substrate a functional element and a signal output portion to output a signal from the functional element are processed, and next in a joining step the surface of a glass substrate is joined to the surface of the first silicon layer of the SOI substrate. In addition to this, in a communicating hole processing step, a communicating hole is provided so as to pass through the glass substrate and in succession to this be further cut into at least a part of the signal output portion. In a last conductive film processing step, a conductive film electrically connected to the functional element is provided on the internal wall surface of the through hole, and through this conductive film the silicon substrate and the outside can be electrically connected.

A method of forming a via hole for use in a mall size electronic part according to the invention is also disclosed. The method for forming a via hole for use in a small size electronic part having a functional element and a signal output portion to output a signal from the functional element to the outside comprises a joining step for joining the surfaces of a silicon substrate and glass substrate, a communicating hole processing step for processing a communicating hole provided so as to pass through the glass substrate and in succession to this be further cut into at least a part of the signal output portion, and a conductive film processing step for processing a conductive film on the internal wall surface of the through hole.

According to the method of forming a via hole, first in a communicating hole processing step a communicating hole is provided so as to pass through a glass substrate and in succession to this be further cut into at least a part of a signal output portion by, for example, sandblasting from the surface side of the glass substrate. Further, in a conductive film processing step, a conductive film electrically connected to a functional element is provided on the internal wall surface of the communicating hole by means of, for example, sputtering, etc., and by this conductive film a silicon substrate and the outside can be electrically connected.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the embodiments according to the present invention are explained in detail with reference to the attached drawings. In order to show the embodiments of the present invention, in FIGS. 1 through 21 an angular velocity sensor is taken as an example of a small size electronic part and explained.

A first embodiment of the present invention is first explained with reference to FIGS. 1 through 11.

Figure 1:
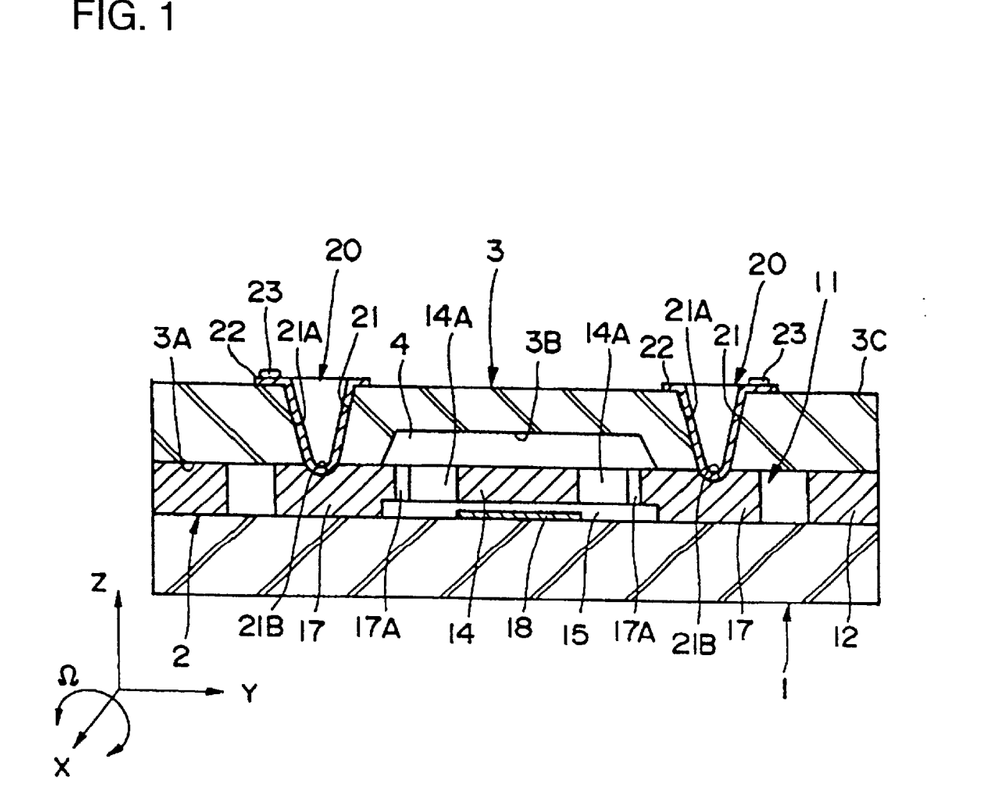
FIG. 1 is a sectional view showing angular velocity sensor according to a first embodiment.

Reference numeral 1 represents a lower glass substrate for example, the thickness of which is about 400 µm, and on the surface side of the lower substrate 1 a silicon substrate 2 to be described later is joined by anodic bonding.

Reference numeral 2 represents a silicon substrate comprising a conductive single-crystal silicon of low resistance, and in the silicon substrate 2 an angular velocity detecting element 11 and frame portion 12 are formed by etching.

Reference numeral 3 represents an upper glass substrate, for example, the thickness of which is about 400 µm, the back side of the upper substrate 3 comprising a bonding surface 3A which is joined to a signal output portion and frame portion 12 of the angular velocity detecting element 11. In the middle of the side of the bonding surface 3A of the upper substrate 3 an accommodating concave portion 3B is formed. The surface of the upper substrate 3 opposite to the bonding surface 3A comprises a non-bonding surface 3C. Further, the upper substrate 3 is joined to the signal output portion and frame portion 12 of the angular velocity detecting element 11 by anodic bonding, and between the lower substrate 1 and the upper substrate 3 a closed space 4 is formed.

Figure 2:
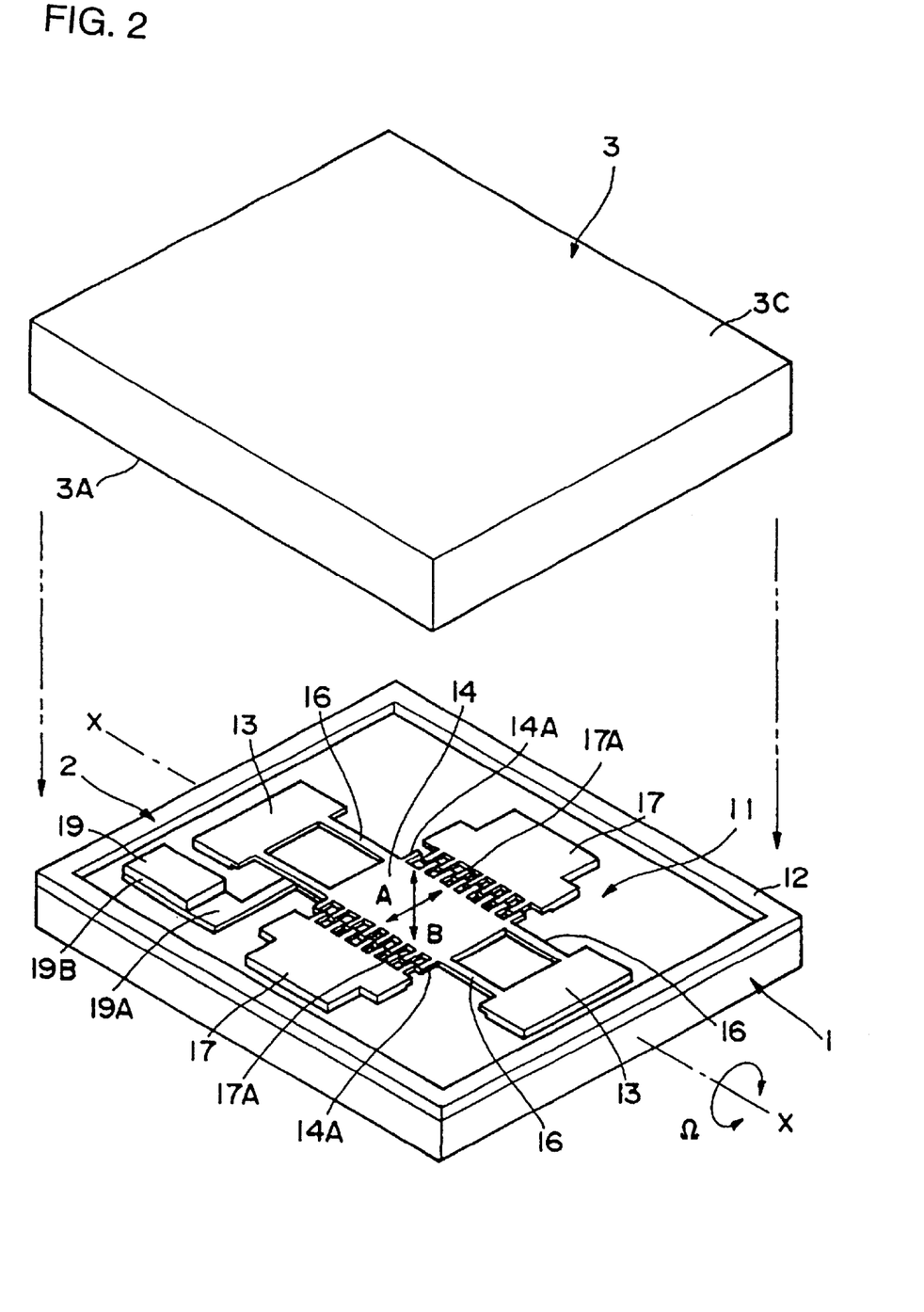
FIG. 2 is an exploded perspective view showing the angular velocity sensor of FIG. 1.

Reference numeral 11 represents an angular velocity detecting element as a functional element (external force detecting element), and when an angular velocity Ω acts around a rotational axis X—X as shown in FIG. 2, the angular velocity detecting element 11 detects the angular velocity Ω around this rotational axis X—X. Further, the angular velocity detecting element 11 is formed inside the frame portion 12 by etching on the silicon substrate 2.

The construction of the angular velocity detecting element 11 is explained with reference to FIG. 2. Reference numeral 13 represent support portions provided on the lower substrate 1, and reference numeral 14 represents a vibrator which is provided in such a way that the vibrator is away from the surface of the lower substrate 1 because of a concave groove portion 15 (FIG. 1) and supported by each of the support portions 13 through four support beams 16, respectively. Via the support beams 16, the vibrator 14 is displaced in the directions of arrow A and arrow B in FIG. 2. Further, on both sides of the vibrator 14 comblike electrodes 14A are formed.

Electrode supports 17 are located on both sides of the vibrator 14 and provided on the lower substrate 1. On the side facing the vibrator 14, of each of the electrode supports 17, a comblike electrode 17A is provided, and each of the comblike electrodes 17A meshes with each of the comblike electrode 14A of the vibrator 14 with a gap between them.

Reference numeral 18 (FIG. 1) is an electrode plate located under the vibrator 14 and provided on the surface of the lower substrate 1. When the vibrator 14 is displaced in the directions of arrows A and B by Coriolis force, the electrode plate 18 is to detect the displacement.

Reference numeral 19 is a lead-out portion connected to the electrode plate 18, and the lead-out portion 19 comprises a wiring portion 19A extended from the electrode plate 18 and a pad portion 19B provided on the wiring portion 19A.

The support portion 13, electrode supports 17, and lead-out portion 19 comprises a signal output portion to electrically connect the angular velocity detecting element 11.

Reference numerals 20 (FIG. 1) represent four via holes (only two are illustrated) formed over from the upper substrate 3 to the angular velocity detecting element 11, and each of the via holes 20 comprises a communicating hole 21 to be described later and a conductive film 22 provided on the internal wall surface of the communicating hole 21.

Reference numerals 21 represent through holes, and each of the through holes 21 comprises a tapered through-hole portion 21A provided through the upper substrate 3 and a concave bottom portion 21B cut into each of the electrode support portions 17 comprising the signal output portion, of the silicon substrate 2 so as to be linked to the through-hole portion 21A. Furthermore, in the embodiment, the communicating hole 21 is illustrated only in the case where the communicating hole is provided in the electrode support portion 17, but through holes are also made in the support portion 13 and lead-out portion 19 in the same way as in FIG. 1.

Further, regarding each of the through holes 21, for example, the diameter of the opening portion on the side of the non-bonding surface 3C is about 300 μm and the diameter on the side of the bonding surface 3A is about 100 μm. Because of this, each of the through holes 21 is formed in a tapered shape where the diameter is gradually reduced over from the side of the non-bonding surface 3C of the upper substrate 3 to the side of the silicon substrate 2.

Reference numerals 22 represent a conductive film provided on the internal wall surface of each of the through holes 22, and the conductive film 22 is extended from the signal output portion (support portion 13, each of the electrode support portions 17, and lead-out portion 19) of the angular velocity detecting element 11 to the side of the non-bonding surface 3C (outside surface) of the upper substrate 3 and is to electrically connect the angular velocity detecting element 11 and the outside.

Reference numerals 23 represent a soldering bump formed in a part located on the side of the non-bonding surface 3C of the upper substrate 3, and when an angular velocity sensor is mounted on a circuit board (not illustrated) and the soldering bump 23 is to electrically connect an electrode pad provided on the circuit board and the conductive film 22. By this, the angular velocity detecting element 11 outputs an electric signal proportional to an angular velocity Ω to, for example, an oscillation circuit, detection circuit, etc. (not illustrated).

In an angular velocity sensor to be constructed this way, between a comblike electrode 14A of a vibrator 14 and a comblike electrode 17A of an electrode support portion 17, a driving signal is applied from an external oscillation circuit through a soldering bump 23, conductive film 22, etc., and the vibrator 14 is made to be vibrated in the direction of arrow A. In this state, when an angular velocity Ω around the rotational axis X—X acts on the angular velocity sensor, Coriolis force acts on the vibrator 14, the vibrator 14 is displaced in the direction of arrow B in proportion to the Coriolis force, and the gap between the vibrator 14 and electrode plate 18 is changed.

The change of the gap is inverted into a signal of a capacitance between the vibrator 14 and electrode plate 18, and this signal is output to a detecting circuit through the conductance film 22 and soldering bump 23. In the detecting circuit, the capacitance is changed into a voltage, and accordingly an angular velocity Ω applied around the rotational axis X—X can be measured.

Next, based on FIGS. 3 through 11, a manufacturing method of an angular velocity sensor according to the present embodiment is described.

Figure 3:
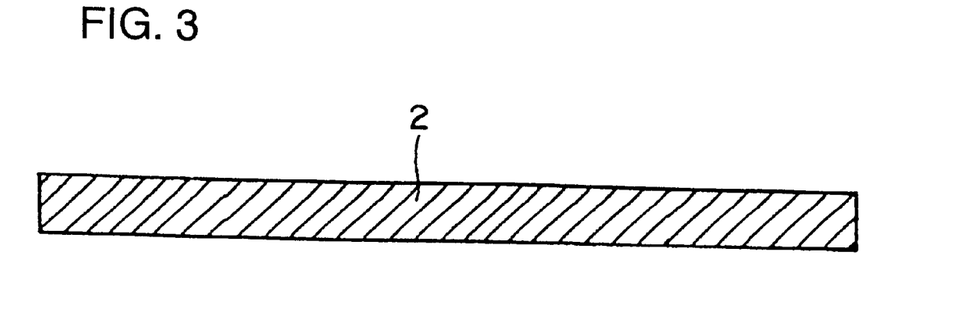
FIG. 3 is a longitudinal sectional view of a silicon substrate showing the state before an angular velocity detecting element and frame portion are formed.

FIG. 3 shows a silicon substrate 2 before the substrate is subjected to processes such as etching treatment. In this silicon substrate 2, an angular velocity detecting element 11 and frame portion 12 are processed in a functional element processing step to be described later.

Figure 4:
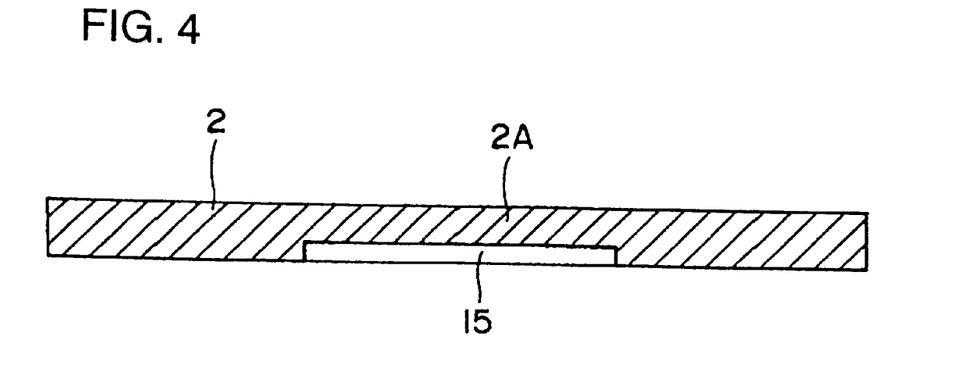
FIG. 4 is a longitudinal sectional view showing the state where a thin portion has been formed in a silicon substrate in a thin portion processing step.

In a thin portion processing step shown in FIG. 4, after a masking film (not illustrated) has been formed on the back side of the silicon substrate 2, a concave groove portion 15 is formed by etching and the part, corresponding to the concave portion 15, of the silicon substrate 2 becomes a thin portion 2A.

Figure 5:
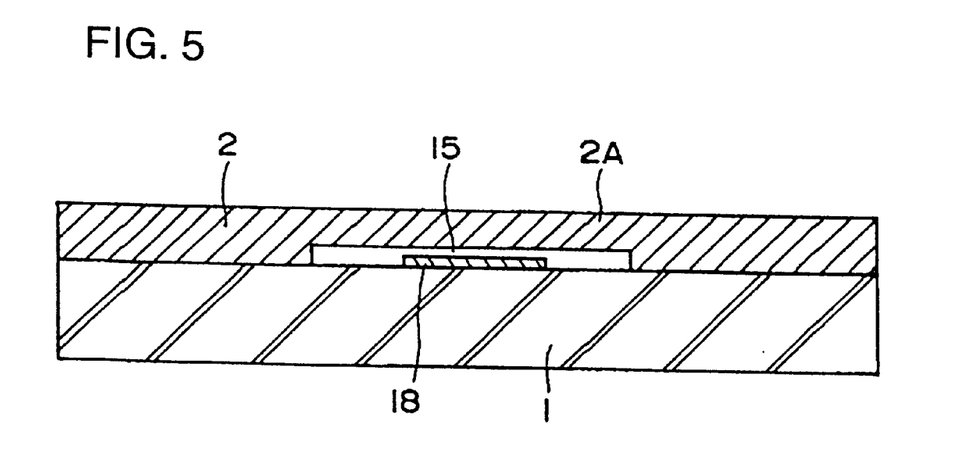
FIG. 5 is a longitudinal sectional view showing the state where a silicon substrate and lower substrate are joined by anodic bonding in a lower substrate joining step.

In a lower substrate joining step as a first joining step shown in FIG. 5, after the back side of the silicon substrate 2 has been physically placed against a lower substrate 1 having an electrode plate 18 formed in advance nearly in the middle portion therein, while these are heated to a joining temperature, a voltage of, for example, about 1000 volts is applied to the lower substrate 1 and silicon substrate 2 and both surfaces of the silicon substrate 2 and lower substrate 1 are joined by anodic bonding.

Figure 6:
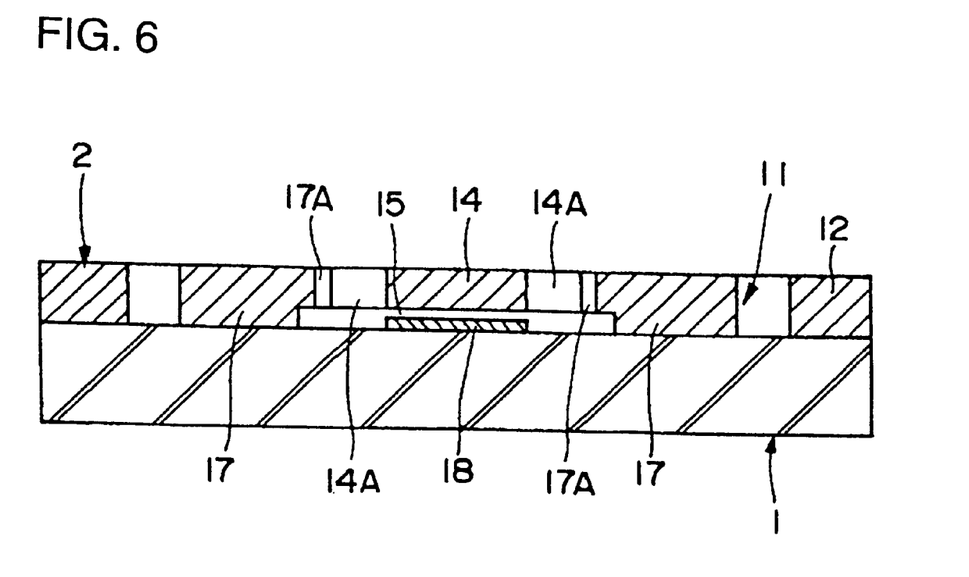
FIG. 6 is a longitudinal sectional view showing the state where an angular velocity detecting element is formed in a silicon substrate in a functional element processing step.

Next, in a functional element processing step shown in FIG. 6, after a masking film (not illustrated) patterned after an angular velocity detecting element 11 and frame portion 12 has been formed, etching treatment is carried out from the surface side of the silicon substrate 2 through the masking film, the angular velocity detecting element 11 is formed in the location corresponding to the thin portion 2A, of the silicon substrate 2 and on its outside the frame portion 12 is processed.

Figure 7:
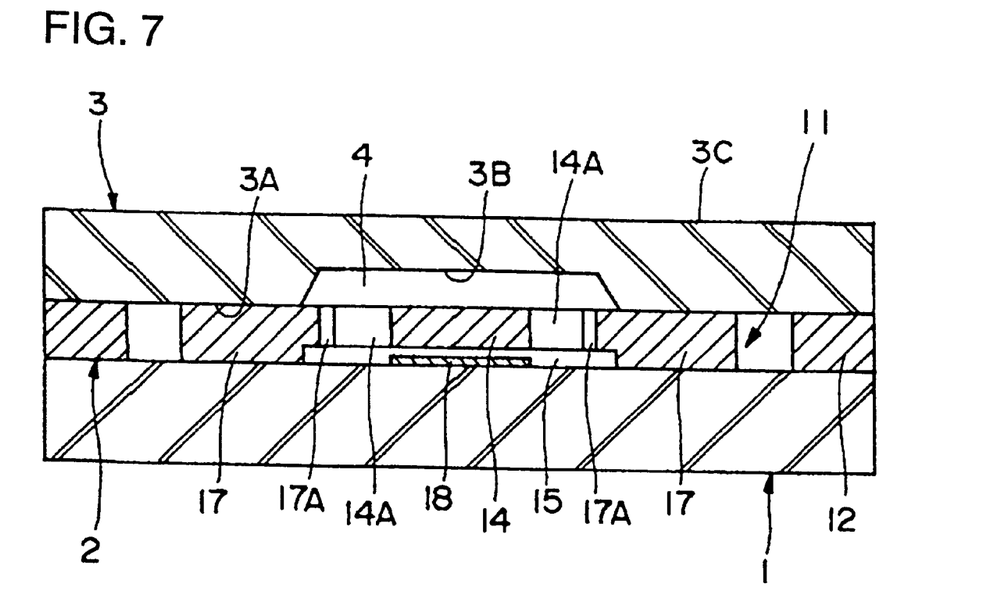
FIG. 7 is a longitudinal sectional view showing the state where a silicon substrate and upper substrate are joined by anodic bonding in an upper substrate joining step.

In an upper joining step as a second joining step shown in FIG. 7, an upper substrate 3, on the back side of which an accommodating concave portion 3B is formed in advance, is brought into contact with a bonding surface 3A so as to cover the angular velocity detecting element 11, and a support portion 13, each of electrode support portions 17, and lead-out portion 19 (See FIG. 2), and a frame portion 12 constituting a signal output portion, of the angular velocity detecting element 11 are brought into contact with the bonding surface 3A. These surfaces are joined by anodic bonding in a reduced atmospheric pressure. At this time, the angular velocity detecting element 11 is now sealed in the closed space 4.

Figure 8:
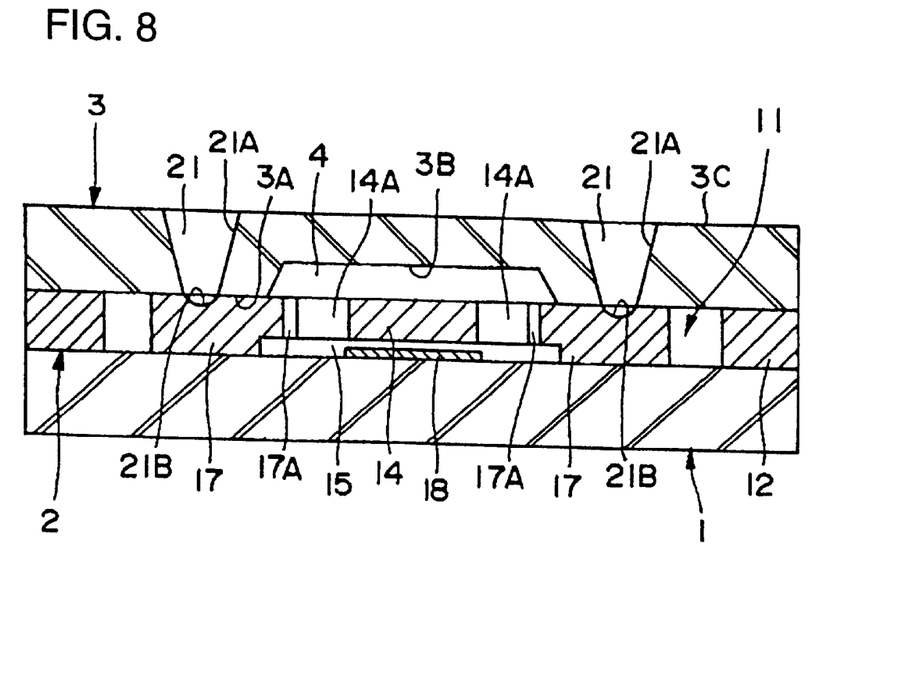
FIG. 8 is a longitudinal sectional view showing the state where a communicating hole is formed in an upper substrate and angular velocity detecting element in a communicating hole processing step.
Figure 9:
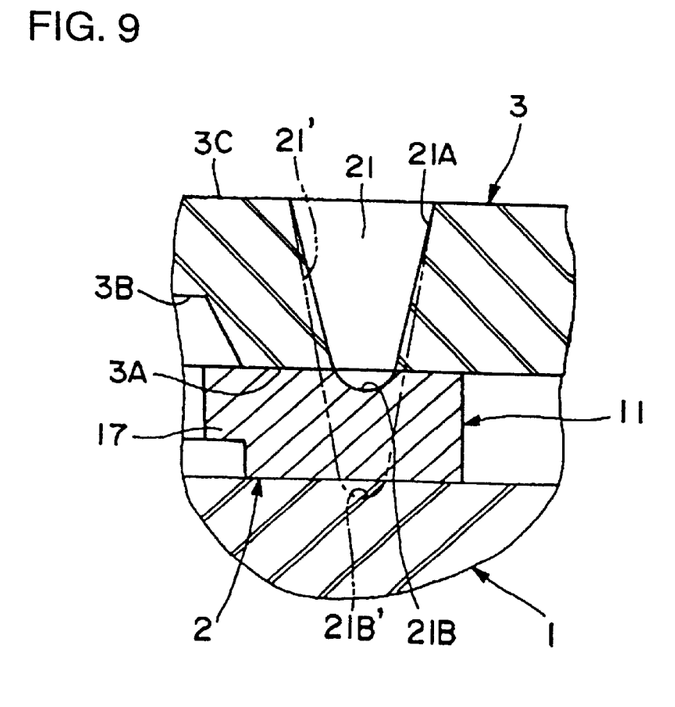
FIG. 9 is an expanded sectional view showing the essential part of FIG. 8.

In a communicating hole processing step shown in FIGS. 8 and 9, after a masking film (not illustrated) patterned after a communicating hole 21 (for example, of a circular shape of about 250 μm in diameter) has been formed on the side of a non-bonding surface 3C of the upper substrate 3, tapered through holes 21 are processed by a mechanical means such as, e.g., sandblasting. At this time, each of the through holes 21 is composed of a through-hole portion 21A disposed so as to pass through the upper substrate 3 and a concave bottom portion 21B linked to the through-hole portion 21A, further cut into each of electrode support portions constituting the signal output portion. See FIG. 9. Because of this, the communicating hole 21, in which the diameter on the side of the non-bonding surface 3C is about 300 μm and the diameter on the side of the bonding surface 3A is about 100 μm, is formed in a tapered shape where the diameter is gradually decreased from the non-bonding surface 3C to the bonding surface 3A, and because the depth of the communicating hole 21 is about 450 μm the concave bottom portion 21B is provided on the surface side of the electrode support portion 17.

Figure 10:
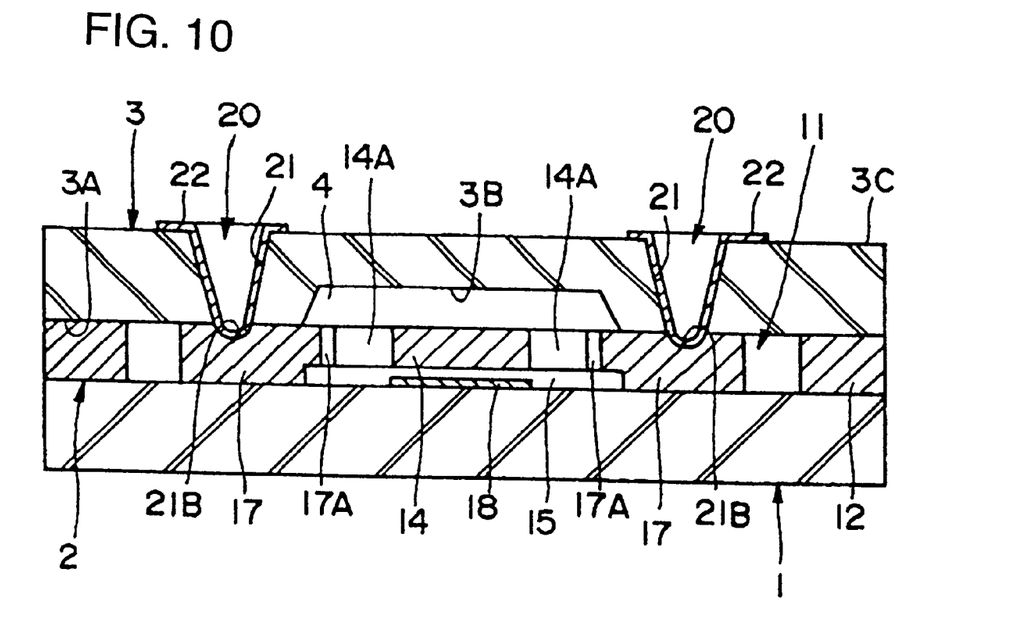
FIG. 10 is a longitudinal sectional view showing the state where a conductive film is formed on the internal wall surface of a communicating hole in a conductive film processing step.
Figure 11:
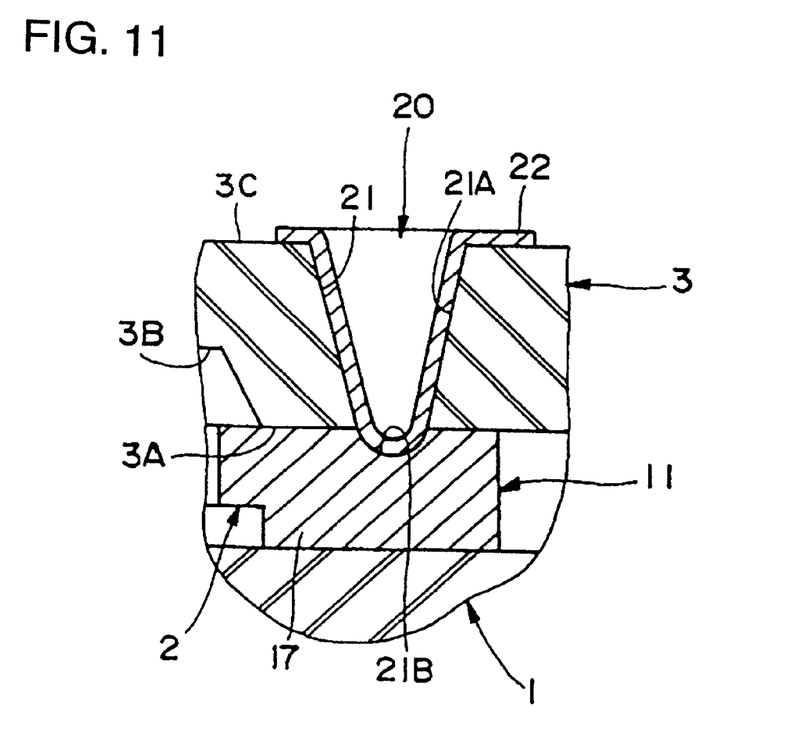
FIG. 11 is an expanded sectional view showing the essential part of FIG. 10.

Further, in a conductive film processing step shown in FIGS. 10 and 11, a metal mask (not illustrated) is arranged on the side of the non-bonding surface 3C of the upper substrate 3 according to the location of the communicating hole 21, a metal thin film of e.g., aluminum, is formed on the internal wall surface of the communicating hole 21 of the upper substrate 3 by means of e.g., sputtering, while using the metal mask as a mask, and thus a conductive film 22 is provided. In this way, in the communicating hole processing step and conductive film processing step, a via hole 20 made up of a communicating hole 21 and conductive film 22 is processed in a part located in the non-bonding surface 3C of the upper substrate 3. The conductive film 22 may comprise a foundation metal of nickel, platinum, etc. Further, a soldering bump 23 is formed on the foundation metal using solders (an alloy of lead and tin, and so on) (see FIG. 1).

At the same time, according to the present embodiment, in an upper substrate joining step, after the surface of the upper substrate 3 has been joined to the silicon substrate 2, the communicating hole 21 of the via hole 20 is provided so as to pass through the upper substrate 3 and the electrode support portion 17 comprising the signal output portion of the angular detecting element 11. After the upper substrate 3 and silicon substrate 2 have been securely joined, the communicating hole 21 can be made. Because of this, when the communicating hole 21 is processed in the upper substrate 3 using mechanical processing means such as, e.g., sandblasting, chips and debris, are not produced on the side of the bonding surface of the upper substrate 3 and a continuous communicating hole 21 can be provided between the upper substrate 3 and silicon substrate 2.

As a result, when the conductive film 22 of the via hole 20 is deposited on the internal wall surface of the communicating hole 21, disconnection of the conductive film 22 due to the chips or other debris is avoided, and the angular velocity detecting element 11 and an external detecting circuit, can be reliably electrically connected by the conductive film 22.

Further, if the conductive film 22 is formed on the internal wall surface of the communicating hole 21 by means of, e.g., sputtering, in comparison with the case in which a conductive paste is filled in the communicating hole 21 as in the conventional technique, the hole diameter of the communicating hole 21 can be reduced, and furthermore a small-sized angular velocity sensor can be provided.

Further, because the communicating hole 21 of via hole 20 is formed in a tapered shape where the diameter gradually decreases from the non-bonding surface 3C of the upper substrate 3 to the bonding surface 3A, when looked at from the side of the non-bonding surface of the upper substrate 3, nearly the whole of the internal wall surface of the communicating hole 21 can be made exposed and accordingly, a conductive film 22 with increased adhesiveness can be easily processed on the internal wall surface of the communicating hole 21 using sputtering, for example.

Moreover, as a soldering bump is provided in a part located in the non-bonding surface 3C of the upper substrate 3, of the conductive film 22, compared with the case in which the soldering bump 23 is directly connected to the concave bottom portion 21B of the communicating hole 21, the diameter of the communicating hole 21 can be decreased. Furthermore, because of the bump 23, an angular velocity sensor can be mounted on the surface of an external circuit board and the mounting surface of the angular velocity sensor can be decreased.

In this way, according to the present embodiment, the angular velocity detecting element 11 and an external oscillation circuit and detecting circuit can be securely connected by the conductive film 22 of the via hole 20, and the reliability of the angular velocity sensor can be increased. Furthermore, because the conductive film 22 is not disconnected, the productivity can be improved by the increase of yield.

On one hand, in an upper substrate joining step for joining the surface of the upper substrate 3 to the silicon substrate 2, as the joining is made to take place in a reduced atmospheric pressure, a closed space can be sealed in a condition such that the atmospheric pressure is reduced in the space and air resistance applied to the vibrator 14 of the angular velocity detecting element 11 can be decreased. As a result, the vibrator 14 can be vibrated at a high speed and at high amplitude and accordingly, the detecting ability of the angular velocity detecting element 11 can be improved.

Furthermore, because the conductive film 22 is provided on the internal wall surface of the communicating hole 21, even if the temperature of the angular velocity sensor is changed, despite the difference of thermal expansion coefficient between the conductive film 22 and upper substrate 3, the stress applied to the upper substrate 3 by the conductive film 22 is light, the appearance of cracks on the upper substrate 3 is suppressed and the life of the angular velocity sensor can be prolonged.

Next, an external force detecting device according to a second embodiment of the present invention, in particular, an example of an angular velocity sensor, is explained with reference to FIGS. 12 through 18. The present embodiment is characterized in that an accommodating concave portion is provided in a glass substrate on the upper side of a silicon substrate and a concave groove portion is provided in a glass substrate on the lower side of the silicon substrate. Moreover, in the present embodiment, the same reference numerals are given the same components as in the above first embodiment, and their explanation is omitted.

Figure 12:
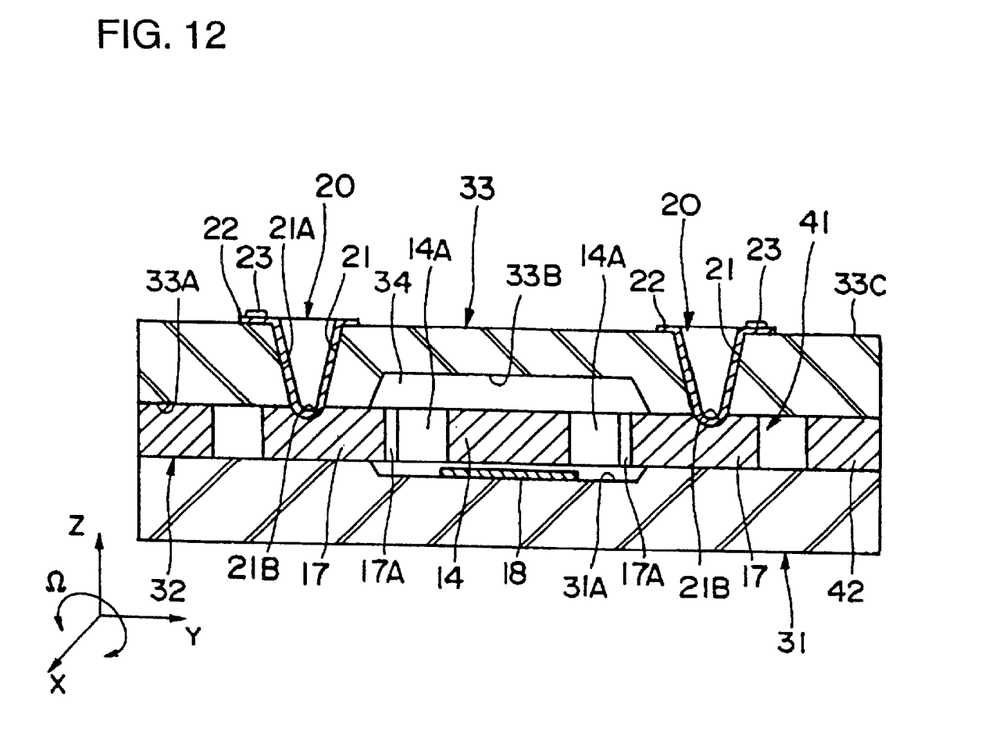
FIG. 12 is a sectional view showing an angular velocity sensor according to a second embodiment.

Reference numeral 31 represents a lower substrate comprising glass, and in the middle portion of the lower substrate 31 a concave portion 31A is formed. Further, on the surface side of the lower substrate 31 an angular velocity detecting element 41 and frame portion 42, to be described later, are provided by a silicon substrate 32 joined to the surface of the lower substrate. Furthermore, on the surface side of the silicon substrate 32 the surface of an upper substrate 33, to be described later, is joined and on the bottom portion of the concave portion 31A of the lower substrate 31 an electrode plate 18 is formed.

Reference numeral 33 represents an upper substrate comprising glass, and the back side of the upper substrate 33 comprises a bonding surface 33A for joining to the angular velocity detecting element 41 and frame portion 42 and in the middle of the bonding surface 33A of the upper substrate 33, an accommodating concave portion 33B is formed. Further, the surface opposite to the bonding surface 33A comprises a non-bonding surface 33C. The bonding surface 33A of the upper substrate 33 is joined to the signal output portion and frame portion 42 of the angular velocity detecting element 41 by anodic bonding, and a closed space is given between the lower substrate 31 and upper substrate 33.

Reference numeral 41 represents the angular velocity detecting element, and although the angular velocity sensor 41 is constructed nearly in the same way as the above angular velocity detecting element 11, the angular velocity sensor is different in that the vibrator 14 is away from the surface of the lower substrate 31 because of the concave portion of the lower substrate 31. Further, the angular velocity detecting element 41 is processed together with the frame portion 42 by etching on the silicon substrate 32.

Next, based on FIGS. 13 through 18, a manufacturing method of an angular velocity sensor according to the present embodiment is described.

Figure 13:
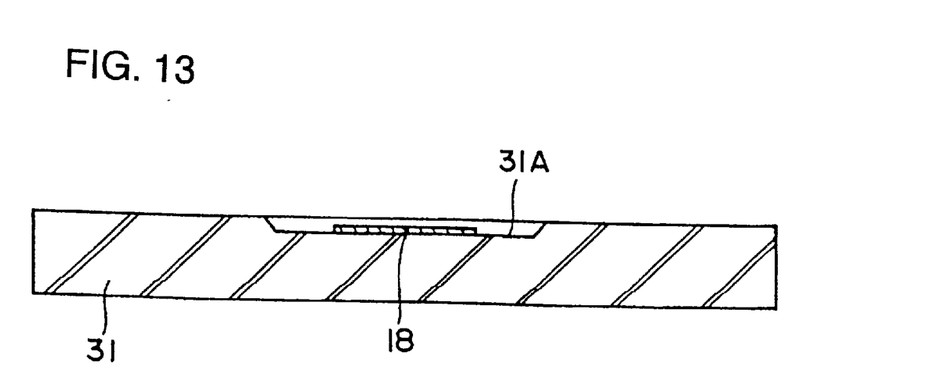
FIG. 13 is a longitudinal sectional view showing the state where a concave portion is formed in a lower substrate in a concave portion processing step.

First, in a concave portion processing step shown in FIG. 13, after a masking film (not illustrated) has been formed on the surface of the lower substrate 31, the concave portion 31A is formed by etching and in the concave portion 31A an electrode plate 18 is processed.

Figure 14:
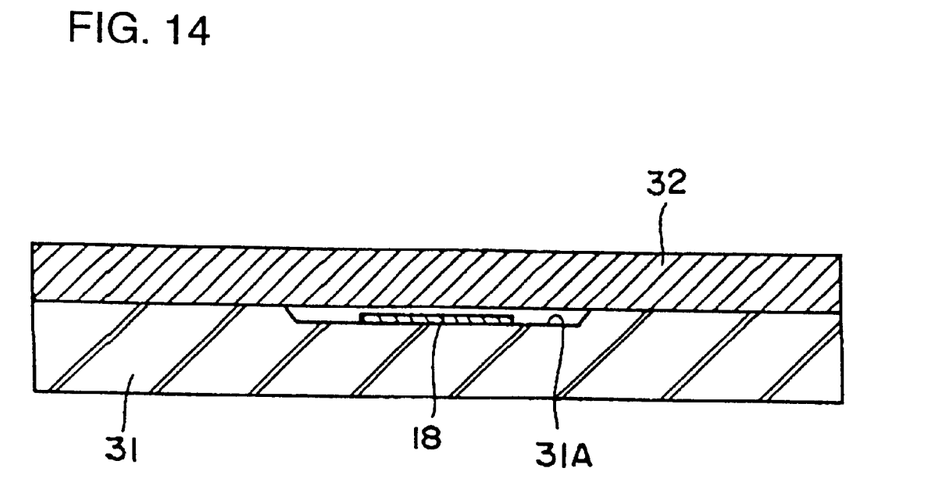
FIG. 14 is a longitudinal sectional view showing the state where a lower substrate and silicon substrate are joined by anodic bonding in a lower substrate joining step.

In a lower substrate joining step, as a first joining step shown in FIG. 14, after the lower surface of the silicon substrate 32 has been physically disposed against the lower substrate 31 having the concave portion 31A formed by the concave portion processing step, while these are heated to a joining temperature, a voltage of, for example, about 1000 volts, is applied to the lower substrate 31 and silicon substrate 32 and both surfaces of the silicon substrate 32.

Figure 15:
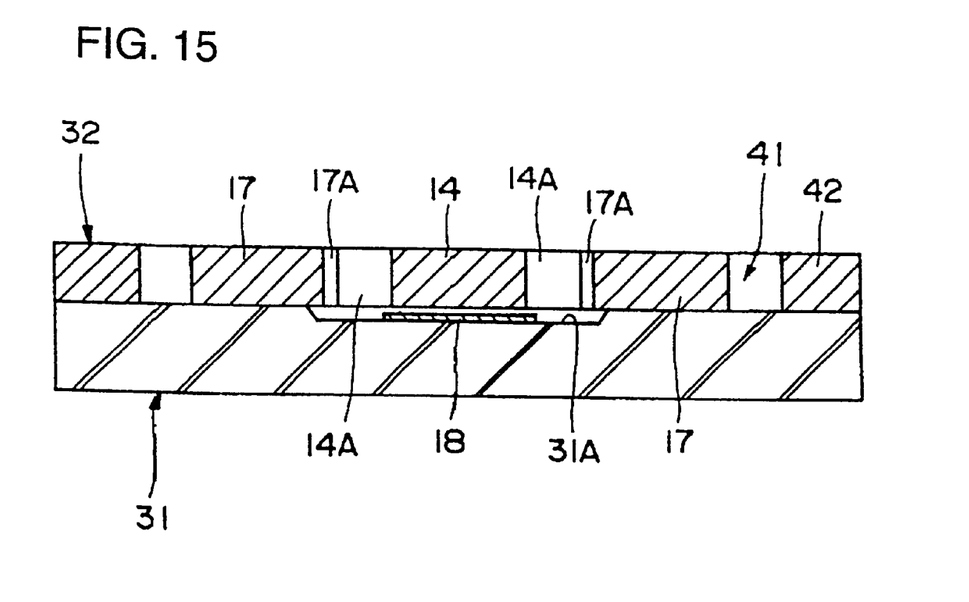
FIG. 15 is a longitudinal sectional view showing the state where an angular velocity detecting element is formed in a silicon substrate in a functional element processing step.

Next, in a functional element processing step shown in FIG. 15, after a masking film (not illustrated) patterned after the angular velocity detecting element 41 and frame portion 42, etching is performed from the upper side of the silicon substrate 32 through the masking film and the angular velocity detecting element 41 and frame portion 41 are processed from the silicon substrate 32.

Figure 16:
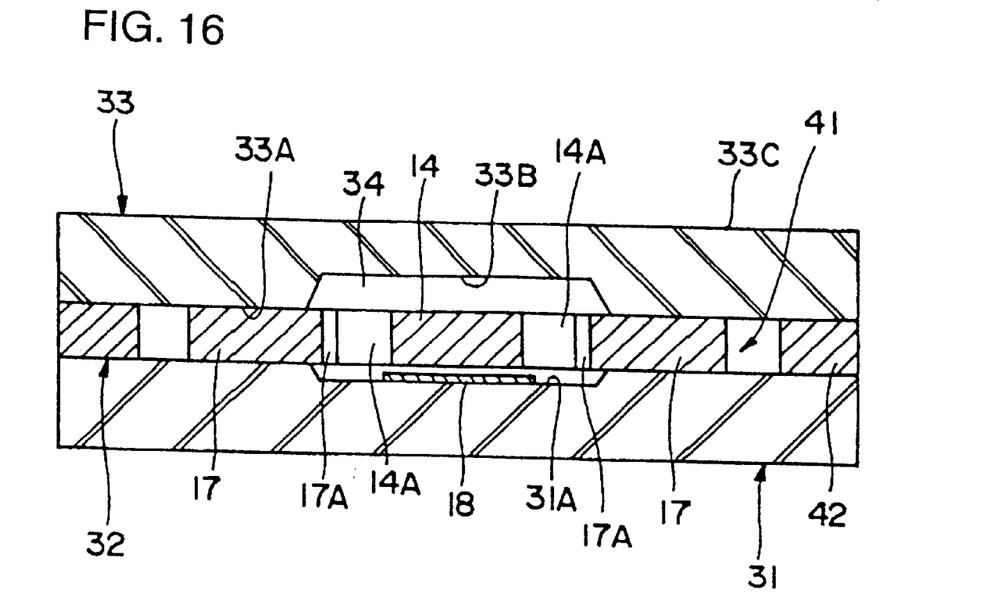
FIG. 16 is a longitudinal sectional view showing the state where a silicon substrate and upper substrate are joined by anodic bonding in an upper substrate joining step.

In an upper substrate joining step as a second joining step shown in FIG. 16, the upper substrate 33 having an accommodating concave portion 33B formed in advance is brought into contact with a bonding surface 33A so as to cover the angular velocity detecting element 41, and a signal output portion (only each of electrode support portions 17 are illustrated) and the frame portion 42 of the angular velocity detecting element 41 are brought into contact with the bonding surface 33A. These surfaces are joined by anodic bonding in a reduced atmospheric pressure. At this time, the angular velocity detecting element is sealed in the closed space 43.

Figure 17:
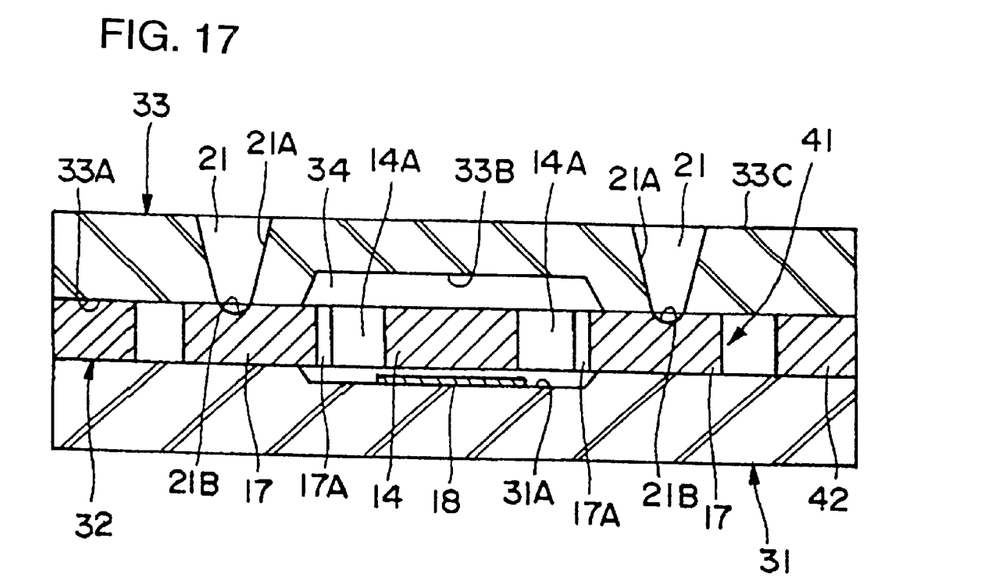
FIG. 17 is longitudinal sectional view showing the state where a communicating hole is formed in an upper substrate and angular velocity detecting element in a communicating hole processing step.

In a communicating hole processing step shown in FIG. 17, after a masking film (not illustrated) patterned after a communicating hole 21 (for example, of a circular shape of about 330 µm in diameter) has been formed on the side of a non-bonding surface 33C of the upper substrate 33, through holes 21 are processed by sandblasting, for example. At this time, each of the communicating holes 21 comprises a tapered through-hole 21A passing through the upper substrate 33 and a concave bottom portion 21B linked to the through-hole portion 21A, cut into the electrode support portion 17 constituting a signal output portion of the silicon substrate 32.

Figure 18:
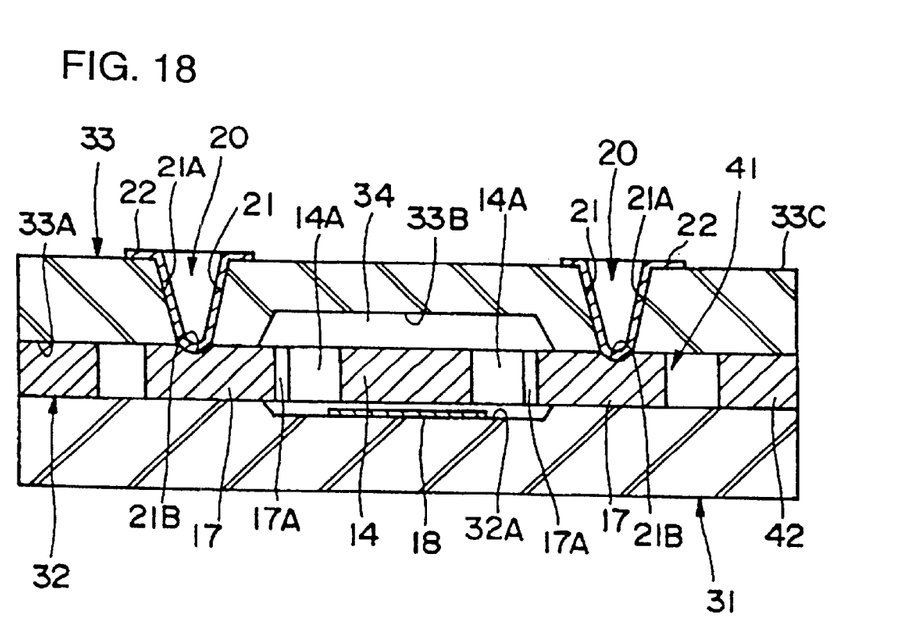
FIG. 18 is longitudinal sectional view showing the state where a conductive film is formed on the internal wall surface of a communicating hole in a conductive film processing step.

Further, in a conductive film processing step shown in FIG. 18, a metal mask (not illustrated) is arranged according to the location of the communicating hole 21, and a metal thin film of, e.g., aluminum, is formed on the internal wall surface of the communicating hole 21 of the upper substrate 33 by means of, for example, sputtering, while using the metal mask as a mask and thus a conductive film is provided. The conductive film 22 leads a signal to be output from the angular velocity detecting element 41 to the side of the non-bonding surface 33C of the upper substrate 33. In this way, by the communicating hole processing step and conductive film processing step, a via hole 20 comprising a communicating hole 21 and conductive film 22 is formed.

Thus, in the present embodiment also, after the surfaces of a lower substrate 31 and silicon substrate 32 have been joined, a communicating hole 21 is formed so as to reach an electrode support portion 17. The conductive film 22 is formed on the internal wall surface of the communicating hole 21, and a via hole 20 comprising the communicating hole 21 and conductive film 22 is thus formed. Accordingly an angular velocity detecting element 41 is electrically connected to an outside detecting circuit, through the conductive film 22 of the via hole 20 and the reliability of the angular velocity sensor is improved.

Next, as an external force detecting device according to a third embodiment of the present invention, an example of an angular velocity sensor is provided and explained with reference to FIGS. 19 and 20. The present embodiment is characterized in that a communicating hole is provided in a lower substrate and a conductive film is provided on the internal wall surface of the through hole. Moreover, in the present embodiment, the same reference numerals are provided the same components as in the above first embodiment, and their explanations are omitted.

Reference numeral 51 represents a lower substrate comprising glass. On the lower substrate 51, the surface of an above-mentioned silicon substrate 2 having an angular velocity detecting element 11 and frame portion 12 is joined. On the surface of the silicon substrate 2, an upper glass substrate 52 is provided, and between the lower substrate 51 and upper substrate 52 a closed space 53 is provided. Further, in the present embodiment, a via hole 54, to be described later, is formed in the lower substrate.

Reference numerals 54 represent four via holes (only two illustrated) formed from the lower surface of the lower substrate 51 to an angular velocity detecting element 11, and each of the via holes 54 comprises a communicating hole 55 to be described later and a conductive film 56 provided on the internal wall surface of the communicating hole 55.

Reference numerals 55 represent through holes, and each of the through holes 55 comprise a through-hole portion 55A passing through the lower substrate 51 and a concave bottom portion 55B in succession to the through-hole portion 55A, cut in an electrode support portion 17 comprising a signal output portion, of the silicon substrate 2.

Reference numerals 56 represent a conductive film provided on the internal wall surface of each of the through holes 55, and the conductive film 56 is extended from the support portion 13, each of electrode support portions 17, and a lead-out portion 19 (only electrode support portion 17 illustrated) of the angular velocity detecting element 11 to the back side of the lower substrate 51 and is to electrically connect the angular velocity detecting element 11 and the outside.

The angular velocity sensor according to the present embodiment has the above construction, and next a forming method of the via holes is explained. Moreover, the steps prior to the processing of via the holes are the same as in FIGS. 3 through 7 according to the above first embodiment, and their explanation is omitted.

Figure 19:
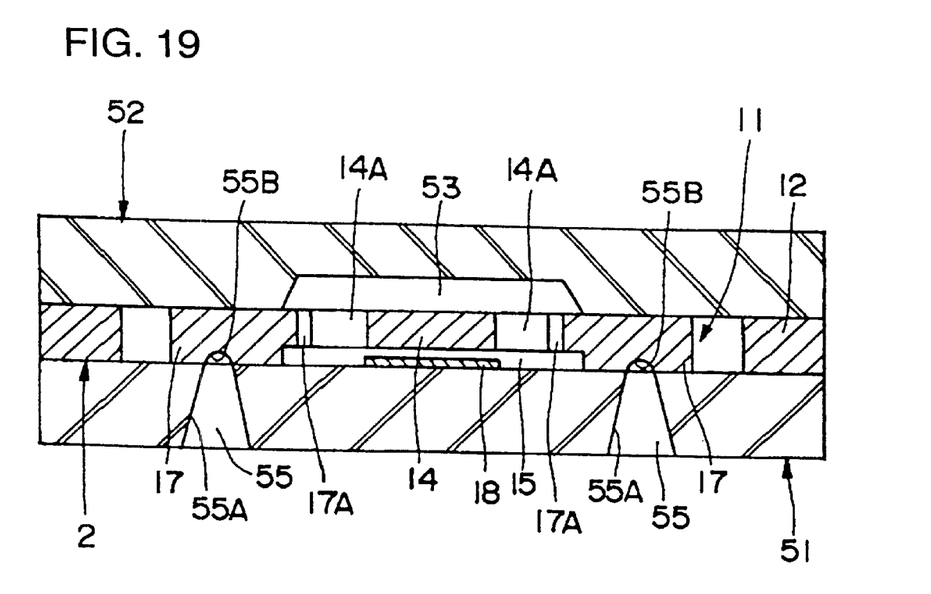
FIG. 19 is longitudinal sectional view showing the state where a communicating hole is formed in a lower substrate and angular velocity detecting element in a communicating hole processing step regarding an angular velocity sensor according to a third embodiment.

First, in a communicating hole processing step shown in FIG. 19, after a masking film (not illustrated) patterned after a communicating hole 55 has been formed on the back side of the lower substrate 51, through holes 55 are processed in the lower substrate 51 by, e.g., sandblasting. At this time, each of the through holes 55 comprises a tapered through-hole portion 55A passing through the lower substrate 51 and a concave bottom portion 55B linked to the through-hole portion 55A, cut in the electrode support portion 7 comprising a signal output potion, of a silicon substrate 2.

Figure 20:
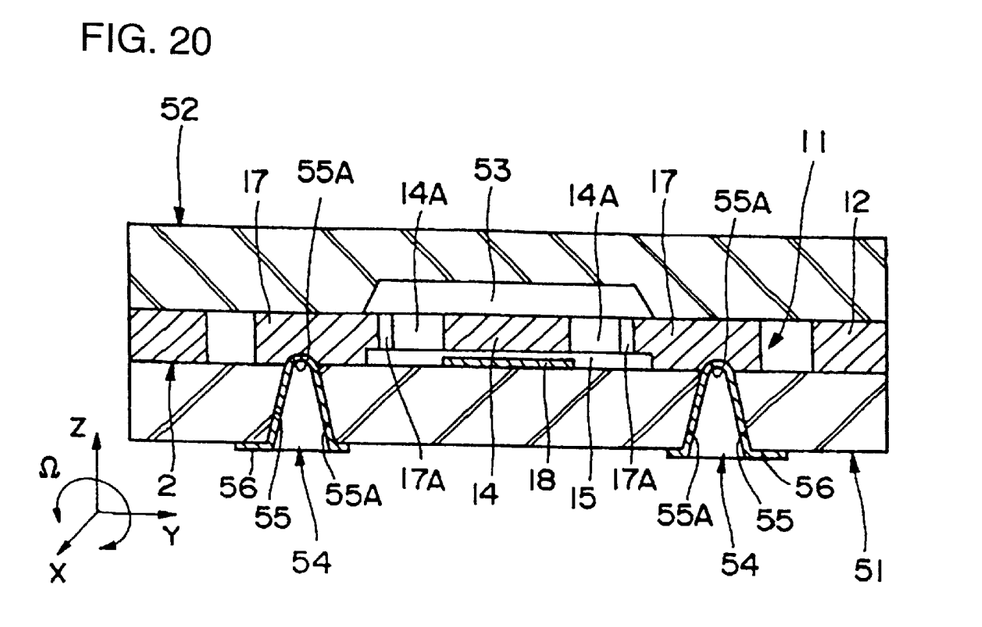
FIG. 20 is longitudinal sectional view showing the state where a conductive film is formed on the internal wall surface of a communicating hole in a conductive film processing step.

In a conductive film processing step shown in FIG. 20, a metal mask (not illustrated) is arranged according to the location of the communicating hole 55, and a metal thin film of, e.g., aluminum, is formed on the internal wall surface of the communicating hole 55 of the lower substrate 51 by means of, for example, sputtering, while using the metal mask as a mask and thus a conductive film is processed. In this way, in the communicating hole processing step and conductive film processing step, a via hole 54 made up of a communicating hole 55 and conductive film 54 is formed.

Thus, in the present embodiment also, after the surfaces of a lower substrate 51 and silicon substrate 2 have been securely joined, the communicating hole 55 is formed so as to reach a part comprising a signal output portion, of the angular velocity detecting element 11, the conductive film 56 is formed on the internal wall surface of the communicating hole 55, and the via hole 54 comprising the communicating hole 55 and conductive hole 56. Because of this, the angular velocity detecting element 11 and external detecting circuit, are electrically connected through the conductive film 56 of the via hole 54, and accordingly, the reliability of the angular velocity sensor can be improved.

Figure 21:
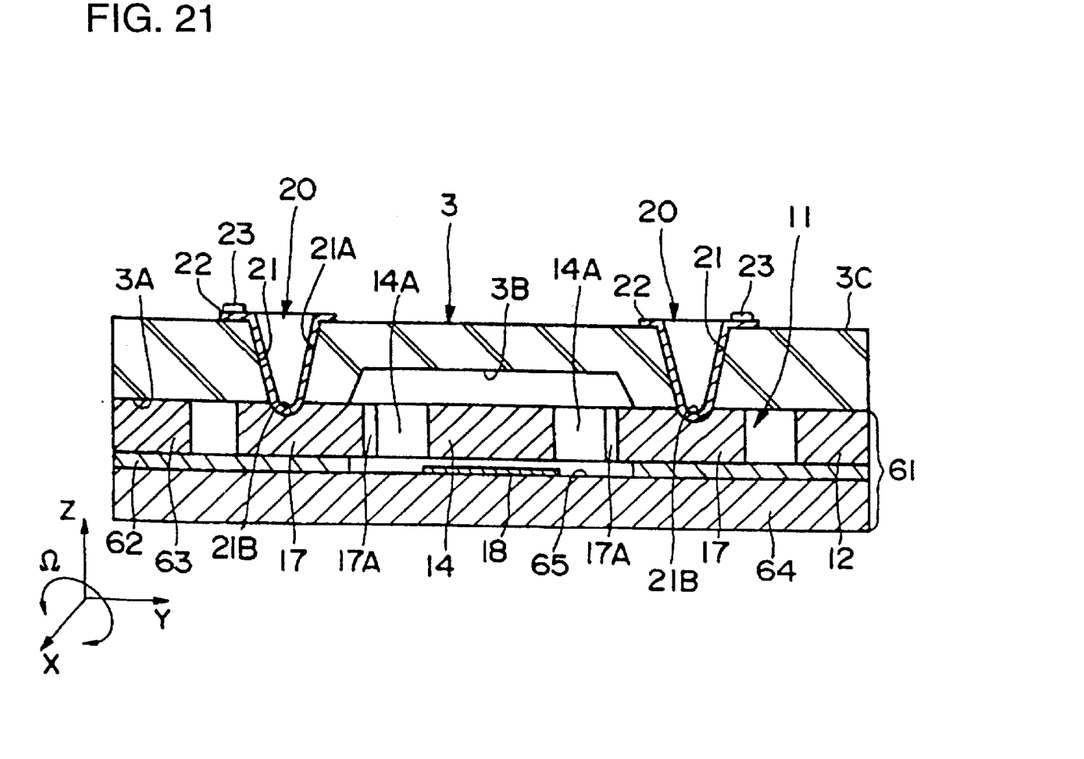
FIG. 21 is a sectional view showing an angular velocity sensor according to a fourth embodiment of the present invention.

Next, based on FIG. 21, a fourth embodiment according to the present invention is described. The present embodiment is characterized in that an SOI substrate having a first and second silicon layer on both sides of an insulating film is used as a silicon substrate. Moreover, in the present embodiment, the same components as in the above first embodiment are provided the same reference numerals, and their explanations are omitted.

Reference numeral 61 represents an SOI (Silicon On Insulator) substrate, and the SOI substrate 61 comprises an insulating film 62 comprising, e.g., a silicon oxide film, a first silicon layer 63 which is provided on the surface side of the insulating film 62 and in which an angular velocity detecting element 11 is formed, and a second silicon layer 64 which is provided on the back side of the insulating film 62 and which comprises a lower substrate. Further, on the surface side of the first silicon layer 63 of the SOI substrate 41 the surface of an upper substrate 3 is joined, and in the upper substrate 3 via holes 20 are formed.

Further, an accommodating concave portion 65 is formed by etching on the middle portion of the insulating film 62, and because of the accommodating concave portion 65, a vibrator 14, is provided so as to be away disposed from the surface of the second silicon layer 64.

Thus, even if the SOI substrate 61 is used, an angular velocity sensor can be constructed, and in the same way as the above angular velocity sensor according to the first embodiment, a signal to be output from the angular velocity detecting element 11 can be lead out to the outside through the via hole 20.

Furthermore, in each of the embodiments, an example of an angular velocity sensor was taken to show how a small size electronic part can be made but the present invention may be applied to not only such a sensor, but also to an acceleration sensor, mechanical filter, etc.

Further, in the communicating hole processing step, holes were made to be cut by sandblasting, but this is not limited to this technique, and through holes may be processed by other techniques such as laser beam machining, electric discharge machining, etc. Further, in the joining step, the example of anodic bonding was used, but joining may be accomplished with other techniques, such as by adhesive, etc., and in short, if only the strength of adhesion between a glass substrate and silicon substrate is secured, this is sufficient.

Further, in each of the embodiments, the conductive film 22 was made to be directly connected to the electrode pad of a circuit board by use of a soldering bump 23, but this is not limited to this technique in the present invention, and the conductive film 22 and the electrode pad of a circuit board may be connected by other techniques, such as wiring, etc.

Further, in each of the embodiments, a communicating hole 21 of a via hole 20 formed in an electrode support portion 17 was illustrated and explained, but this is not limited to this technique, and in the support portion 1 and lead-out portion 19 a via hole may be formed in the same way.

Furthermore, in the communicating hole 21, the concave bottom portion 21B was made to be provided in a part (for example, each of electrode support portions 17) comprising an angular velocity detecting element 11, but the present invention this is not limited to this technique, and like the communicating hole 21' shown by a two-dot chain line in FIG. 9, the communicating hole may be formed in such a way that a concave bottom portion 21B' is formed in the lower substrate 1 and the communicating hole passes through the electrode support portion 17 (signal output portion). Further, the communicating hole may be formed so as to pass through the upper substrate 3, silicon substrate 2, and lower substrate 1 downward.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A small size electronic part comprising:
   a silicon substrate having a functional element and a signal output portion to output a signal from the functional element outside the electronic part;
   a glass substrate provided on the silicon substrate such that the signal output portion of the silicon substrate is in contact with the glass substrate; a communicating hole provided in the glass substrate and in at least a portion of the signal output portion of the silicon substrate so as to pass through the glass substrate and cut into at least a part of the signal output portion; and
   a conductive film provided on an inner wall surface of the communicating hole and extending on a surface of the glass substrate.

2. The small size electronic part of claim 1, wherein the functional element is sealed by the glass substrate.

3. The small size electronic part of claim 1, wherein the communicating hole has a tapered shape wherein a diameter thereof reduces from an opening side of the glass substrate to the silicon substrate.

4. The small size electronic part of claim 1, wherein a soldering bump is provided in a part of the conductive film located on the surface of the glass substrate.

5. The small size electronic part of claim 1, wherein the functional element comprises an external force detecting element for detecting external force including angular velocity and acceleration.

6. The small size electronic part of claim 1, further comprising a further glass substrate bonded on a back side of the silicon substrate.

7. The small size electronic part of claim 1, wherein the silicon substrate comprises an SOI substrate having an insulating film, a first silicon layer provided on a surface of the insulating film and having the functional element and signal output portion provided therein, and a second silicon layer provided on a back side of the insulating film, wherein the glass substrate is provided on the surface of the first silicon layer of the SOI substrate, and wherein the communicating hole is provided in the glass substrate and first silicon layer.

8. The small size electronic part of claim 1, wherein the communicating hole extends through the signal output portion of the silicon substrate.

9. The small size electronic part of claim 1, wherein a recess is disposed in the glass substrate adjacent the functional element.

10. The small size electronic part of claim 1, wherein a recess is disposed in the silicon substrate for accommodating a portion of the functional element.

11. The small size electronic part of claim 6, wherein a recess is disposed in the further glass substrate for accommodating a portion of the functional element.

* * * * *